US007665951B2

(12) United States Patent
Kurita et al.

(10) Patent No.: US 7,665,951 B2
(45) Date of Patent: Feb. 23, 2010

(54) MULTIPLE SLOT LOAD LOCK CHAMBER AND METHOD OF OPERATION

(75) Inventors: Shinichi Kurita, San Jose, CA (US); Suhail Anwar, San Jose, CA (US); Jae-Chull Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 331 days.

(21) Appl. No.: 11/421,793

(22) Filed: Jun. 2, 2006

(65) Prior Publication Data

US 2007/0280816 A1 Dec. 6, 2007

(51) Int. Cl.
*B65G 49/07* (2006.01)
(52) U.S. Cl. .................. 414/805; 414/217; 414/939
(58) Field of Classification Search .............. 414/805, 414/939, 217
See application file for complete search history.

(56) References Cited

U.S. PATENT DOCUMENTS

| 3,976,330 | A | 8/1976 | Babinski et al. |
|---|---|---|---|
| 4,047,624 | A | 9/1977 | Dorenbos |
| 4,178,113 | A | 12/1979 | Beaver, II et al. |
| 4,311,542 | A | 1/1982 | Mueller et al. |
| 4,512,391 | A | 4/1985 | Harra |
| 4,680,061 | A | 7/1987 | Lamont, Jr. |
| 4,687,542 | A | 8/1987 | Davis et al. |
| 4,693,777 | A | 9/1987 | Hazano et al. |
| 4,709,655 | A | 12/1987 | Van Mastrigt |
| 4,759,681 | A | 7/1988 | Nogami |
| 4,770,590 | A | 9/1988 | Hugues et al. |
| 4,775,281 | A | 10/1988 | Prentakis |
| 4,784,377 | A | 11/1988 | Woodward |
| 4,785,962 | A | 11/1988 | Toshima |

(Continued)

FOREIGN PATENT DOCUMENTS

EP 0359525 3/1990

(Continued)

OTHER PUBLICATIONS

Iscoff, R., ed, "Dry Etching Systems: Gearing Up for Larger Wafers", Semiconductor International, Oct. 1985, pp. 49-60.

(Continued)

*Primary Examiner*—James Keenan
(74) *Attorney, Agent, or Firm*—Patterson & Sheridan

(57) ABSTRACT

Embodiments of the invention include a load lock chamber, a processing system having a load lock chamber and a method for transferring substrates between atmospheric and vacuum environments. In one embodiment, the method includes maintaining a processed substrate within a transfer cavity formed in a chamber body for two venting cycles. In another embodiment, the method includes transferring a substrate from a transfer cavity to a heating cavity formed in the chamber body, and heating the substrate in the heating cavity. In another embodiment, a load lock chamber includes a chamber body having substrate support disposed in a transfer cavity. The substrate support is movable between a first elevation and a second elevation. A plurality of grooves are formed in at least one of a ceiling or floor of the transfer cavity and configured to receive at least a portion of the substrate support when located in the second elevation.

18 Claims, 11 Drawing Sheets

U.S. PATENT DOCUMENTS

| | | | |
|---|---|---|---|
| 4,801,241 A | 1/1989 | Zajac et al. | |
| 4,816,098 A | 3/1989 | Davis et al. | |
| 4,828,224 A | 5/1989 | Crabb et al. | |
| 4,836,733 A | 6/1989 | Hertel et al. | |
| 4,846,102 A | 7/1989 | Ozias | |
| 4,857,689 A | 8/1989 | Lee | |
| 4,863,547 A | 9/1989 | Shidahara et al. | |
| 4,870,923 A | 10/1989 | Sugimoto | |
| 4,895,107 A | 1/1990 | Yano et al. | |
| 4,911,103 A | 3/1990 | Davis et al. | |
| 4,913,929 A | 4/1990 | Moslehi et al. | |
| 4,923,584 A | 5/1990 | Bramhall, Jr. et al. | |
| 4,951,601 A | 8/1990 | Mayden et al. | |
| 4,952,299 A | 8/1990 | Chrisos et al. | |
| 4,966,519 A | 10/1990 | Davis et al. | |
| 4,989,543 A | 2/1991 | Schmitt | |
| 4,990,047 A | 2/1991 | Wagner et al. | |
| 5,001,327 A | 3/1991 | Hirasawa et al. | |
| 5,020,475 A | 6/1991 | Crabb et al. | |
| 5,044,871 A | 9/1991 | Davis et al. | |
| 5,060,354 A | 10/1991 | Chizinsky | |
| 5,131,460 A | 7/1992 | Krueger | |
| 5,186,718 A | 2/1993 | Tepman et al. | |
| 5,187,115 A | 2/1993 | Coleman | |
| 5,199,483 A | 4/1993 | Bahng | |
| 5,202,716 A | 4/1993 | Tateyama et al. | |
| 5,224,809 A | 7/1993 | Maydan et al. | |
| 5,227,708 A | 7/1993 | Lowrance | |
| 5,252,807 A | 10/1993 | Chizinsky | |
| 5,254,170 A | 10/1993 | Devilbiss et al. | |
| 5,259,881 A | 11/1993 | Edwards et al. | |
| 5,259,883 A | 11/1993 | Yamabe et al. | |
| 5,261,935 A | 11/1993 | Ishii et al. | |
| 5,288,379 A | 2/1994 | Namiki et al. | |
| 5,292,393 A | 3/1994 | Maydan et al. | |
| 5,352,294 A | 10/1994 | White et al. | |
| 5,355,066 A | 10/1994 | Lowrance | |
| 5,374,147 A | 12/1994 | Hiroki et al. | |
| 5,376,212 A | 12/1994 | Saiki | |
| 5,404,894 A | 4/1995 | Shiraiwa | |
| 5,421,889 A | 6/1995 | Pollock et al. | |
| 5,439,547 A * | 8/1995 | Kumagai | 156/345.31 |
| 5,443,346 A | 8/1995 | Murata et al. | |
| 5,445,484 A | 8/1995 | Kato et al. | |
| 5,447,409 A | 9/1995 | Grunes et al. | |
| 5,464,313 A | 11/1995 | Ohsawa | |
| 5,469,035 A | 11/1995 | Lowrance | |
| 5,470,784 A | 11/1995 | Coleman | |
| 5,474,410 A | 12/1995 | Ozawa et al. | |
| 5,512,320 A | 4/1996 | Turner et al. | |
| 5,516,732 A | 5/1996 | Flegal | |
| 5,536,128 A | 7/1996 | Shimoyashiro et al. | |
| 5,562,383 A | 10/1996 | Iwai et al. | |
| 5,570,994 A | 11/1996 | Somekh et al. | |
| 5,586,585 A | 12/1996 | Bonora et al. | |
| 5,588,827 A | 12/1996 | Muka | |
| 5,607,009 A | 3/1997 | Turner et al. | |
| 5,609,689 A * | 3/1997 | Kato et al. | 118/719 |
| 5,611,655 A | 3/1997 | Fukasawa et al. | |
| 5,611,865 A | 3/1997 | White et al. | |
| 5,615,988 A | 4/1997 | Wiesler et al. | |
| 5,616,208 A | 4/1997 | Lee | |
| 5,636,964 A | 6/1997 | Somekh et al. | |
| 5,655,277 A | 8/1997 | Galdos et al. | |
| 5,674,786 A | 10/1997 | Turner et al. | |
| 5,685,684 A | 11/1997 | Kato et al. | |
| 5,695,568 A | 12/1997 | Sinha et al. | |
| 5,697,749 A | 12/1997 | Iwabuchi et al. | |
| 5,700,127 A | 12/1997 | Harada et al. | |
| 5,716,207 A | 2/1998 | Mishina et al. | |
| 5,738,767 A | 4/1998 | Coad et al. | |
| 5,751,003 A | 5/1998 | Rose et al. | |
| 5,784,799 A | 7/1998 | Kato et al. | |
| 5,793,050 A | 8/1998 | Rose et al. | |
| 5,795,355 A | 8/1998 | Moran | |
| 5,820,679 A | 10/1998 | Yokoyama et al. | |
| 5,833,426 A | 11/1998 | Marohl | |
| 5,855,681 A | 1/1999 | Maydan et al. | |
| 5,855,726 A | 1/1999 | Soraoka et al. | |
| 5,882,165 A | 3/1999 | Maydan et al. | |
| 5,884,009 A | 3/1999 | Okase | |
| 5,891,251 A | 4/1999 | MacLeish et al. | |
| 5,902,088 A | 5/1999 | Fairbairn et al. | |
| 5,909,994 A | 6/1999 | Blum et al. | |
| 5,913,978 A | 6/1999 | Kato et al. | |
| 5,934,856 A | 8/1999 | Asakawa et al. | |
| 5,942,013 A | 8/1999 | Akimoto | |
| 5,944,857 A | 8/1999 | Edwards et al. | |
| 5,951,770 A | 9/1999 | Perlov et al. | |
| 5,954,472 A | 9/1999 | Hofmeister et al. | |
| 5,961,269 A | 10/1999 | Kroeker | |
| 5,989,346 A | 11/1999 | Hiroki | |
| 5,997,235 A | 12/1999 | Hofmeister | |
| 6,007,675 A | 12/1999 | Toshima | |
| 6,012,192 A | 1/2000 | Sawada et al. | |
| 6,016,611 A | 1/2000 | White et al. | |
| 6,034,000 A | 3/2000 | Heyder et al. | |
| 6,039,770 A | 3/2000 | Yang et al. | |
| 6,042,623 A | 3/2000 | Edwards | |
| 6,044,534 A | 4/2000 | Seo et al. | |
| 6,048,154 A | 4/2000 | Wytman | |
| 6,053,686 A * | 4/2000 | Kyogoku | 414/217 |
| 6,059,507 A | 5/2000 | Adams | |
| 6,079,693 A | 6/2000 | Ettinger et al. | |
| 6,082,950 A | 7/2000 | Altwood et al. | |
| 6,086,362 A | 7/2000 | White et al. | |
| 6,106,634 A | 8/2000 | Ghanayem et al. | |
| 6,143,083 A | 11/2000 | Yonemitsu et al. | |
| 6,145,673 A | 11/2000 | Burrows et al. | |
| 6,176,667 B1 | 1/2001 | Fairbairn et al. | |
| 6,176,668 B1 | 1/2001 | Kurita et al. | |
| 6,193,507 B1 | 2/2001 | White et al. | |
| 6,206,176 B1 | 3/2001 | Blonigan | |
| 6,213,704 B1 | 4/2001 | White et al. | |
| 6,215,897 B1 | 4/2001 | Beer et al. | |
| 6,224,680 B1 | 5/2001 | Toshima | |
| 6,235,634 B1 | 5/2001 | White et al. | |
| 6,254,328 B1 | 7/2001 | Wytman | |
| 6,270,582 B1 | 8/2001 | Rivkin et al. | |
| 6,286,230 B1 | 9/2001 | White et al. | |
| 6,309,161 B1 * | 10/2001 | Hofmeister | 414/221 |
| 6,315,512 B1 | 11/2001 | Tabrizi et al. | |
| 6,318,945 B1 | 11/2001 | Hofmeister | |
| 6,338,626 B1 | 1/2002 | Saeki | |
| 6,340,405 B2 | 1/2002 | Park | |
| 6,382,895 B1 | 5/2002 | Konishi et al. | |
| 6,410,455 B1 | 6/2002 | Kuribayashi et al. | |
| 6,431,807 B1 | 8/2002 | Stevens et al. | |
| 6,435,868 B2 | 8/2002 | White et al. | |
| 6,450,750 B1 | 9/2002 | Heyder et al. | |
| 6,486,444 B1 * | 11/2002 | Fairbairn et al. | 219/390 |
| 6,503,365 B1 | 1/2003 | Kim et al. | |
| 6,506,693 B2 * | 1/2003 | Heyder et al. | 438/106 |
| 6,517,303 B1 | 2/2003 | White et al. | |
| 6,558,509 B2 | 5/2003 | Kraus et al. | |
| 6,568,552 B1 | 5/2003 | Tabrizi et al. | |
| 6,568,899 B1 | 5/2003 | Kuribayashi et al. | |
| 6,602,797 B2 | 8/2003 | Kuribayashi et al. | |
| 6,609,869 B2 | 8/2003 | Aggarwal et al. | |
| 6,610,150 B1 | 8/2003 | Savage et al. | |
| 6,647,665 B1 | 11/2003 | Tabrizi et al. | |
| 6,688,375 B1 * | 2/2004 | Turner et al. | 165/48.1 |
| 6,719,517 B2 * | 4/2004 | Beaulieu et al. | 414/217 |
| 6,729,824 B2 * | 5/2004 | Lei et al. | 414/217 |

| | | | |
|---|---|---|---|
| 6,734,950 B2 * | 5/2004 | Nakano ................... 355/72 |
| 6,742,977 B1 * | 6/2004 | Okayama et al. ........... 414/217 |
| 6,746,195 B2 * | 6/2004 | Shirai ..................... 414/217 |
| 6,918,731 B2 * | 7/2005 | Talmer .................... 414/217 |
| 6,949,143 B1 | 9/2005 | Kurita et al. |
| 7,207,766 B2 * | 4/2007 | Kurita et al. ............. 414/641 |
| 7,236,229 B2 * | 6/2007 | Edo ....................... 355/53 |
| 7,422,406 B2 * | 9/2008 | van der Meulen .......... 414/217 |
| 7,458,763 B2 * | 12/2008 | van der Meulen .......... 414/805 |
| 2002/0034886 A1 | 3/2002 | Kurita et al. |
| 2002/0137346 A1 | 9/2002 | Donaldson et al. |
| 2002/0159864 A1 | 10/2002 | Lowrance |
| 2004/0149210 A1 | 8/2004 | Fink |
| 2005/0095088 A1 | 5/2005 | Kurita et al. |
| 2005/0118000 A1 * | 6/2005 | Kasai et al. ............. 414/217 |
| 2006/0177288 A1 * | 8/2006 | Parker et al. ............ 414/217 |

FOREIGN PATENT DOCUMENTS

| | | |
|---|---|---|
| EP | 0607797 | 7/1994 |
| EP | 0 608 620 | 8/1994 |
| EP | 0608633 | 8/1994 |
| EP | 0684630 | 11/1995 |
| EP | 0756316 | 1/1997 |
| EP | 0 935 279 | 8/1999 |
| JP | 64-028933 | 1/1989 |
| JP | 02-152251 | 6/1990 |
| JP | 3136345 | 6/1991 |
| JP | 03-274746 | 12/1991 |
| JP | 04-098848 | 3/1992 |
| JP | 04-240721 | 8/1992 |
| JP | 05-013551 | 1/1993 |
| JP | 5-179447 | 7/1993 |
| JP | 05-283500 | 10/1993 |
| JP | 06-104326 | 4/1994 |
| JP | 06-156624 | 6/1994 |
| JP | 06-163505 | 6/1994 |
| JP | 7-86169 | 3/1995 |
| JP | 8-264452 | 10/1996 |
| JP | 10-107126 | 4/1998 |
| JP | 00-195925 | 7/2000 |
| KR | 2000-35354 | 6/2000 |
| KR | 2005-37964 | 4/2005 |
| WO | WO 99/13504 | 3/1999 |
| WO | WO 99/18603 | 4/1999 |
| WO | WO 99/59928 | 11/1999 |
| WO | WO 99/60609 | 11/1999 |
| WO | WO 99/60610 | 11/1999 |
| WO | WO 99/60611 | 11/1999 |
| WO | WO 99/60612 | 11/1999 |
| WO | WO 99/61350 | 12/1999 |

OTHER PUBLICATIONS

Declaration of Thomas B. Brezocsky, dated Jan. 29, 1999.
U.S. Appl. No. 11/332,781, filed Jan. 13, 2003 by Lee, et al., entitled "Decoupled Chamber Body".
Korean Office Action, Patent Application No. 10-2007-7023938, dated Feb. 27, 2009.
International Search Report and Written Opinion dated Sep. 24, 2008 for International Application No. PCT/US07/70246.
PCT Search Report, International Application No. PCT/US07/70246, dated Oct. 2, 2008.

* cited by examiner

MULTIPLE SLOT LOAD LOCK CHAMBER AND METHOD OF OPERATION

BACKGROUND OF THE INVENTION

1. Field of the Invention

Embodiments of the invention generally relate to a load lock chamber for a vacuum processing system, and a method for operating same.

2. Description of the Related Art

Two rapidly evolving technology areas are thin film transistors and photovoltaic devices. Thin film transistors (TFT) formed by flat panel technology are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

Photovoltaic devices (PV) or solar cells are devices which convert sunlight into direct current (DC) electrical power. PV or solar cells typically have one or more p-n junctions formed on a panel. Each junction comprises two different regions within a semiconductor material where one side is denoted as the p-type region and the other as the n-type region. When the p-n junction of the PV cell is exposed to sunlight (consisting of energy from photons), the sunlight is directly converted to electricity through the PV effect. In general, a high quality silicon-based material is desired to produce high efficiency junction devices (i.e., high power output per unit area). Amorphous silicon (a-Si) film has been widely used as the silicon-based panel material in PV solar cells due to its low cost to manufacture in conventional low temperature plasma enhanced chemical vapor deposition (PECVD) processes.

With the marketplace's acceptance of flat panel technology and desire for more efficient PV devices to offset spiraling energy costs, the demand for larger panels, increased production rates and lower manufacturing costs have driven equipment manufacturers to develop new systems that accommodate larger size substrates for flat panel display and PV device fabricators. Current substrate processing equipment is generally configured to accommodate substrates slightly greater than about two square meters. Processing equipment configured to accommodate larger substrate sizes is envisioned in the immediate future.

Equipment to fabricate such large substrates represents a substantial investment to fabricators. Conventional systems require large and expensive hardware. In order to offset this investment, high substrate throughput is very desirable.

Heating and/or cooling of the substrate within the load lock chamber is an important aspect for achieving high system throughput. As future processing systems are envisioned to process even larger size substrates, the need for uniform rapid heating and cooling of large area substrates is of great concern. As such, advancements which promote uniform temperature regulation and high heat transfer rates are highly desirable.

Thus, there is a need for an improved method and apparatus that facilitates rapid and uniform heating and cooling of larger area substrates.

SUMMARY OF THE INVENTION

Embodiments of the invention include a load lock chamber, a processing system having a load lock chamber and a method for transferring substrates between an atmospheric environment and a vacuum environment. In one embodiment, a method for transferring substrates between atmospheric and a vacuum environments includes maintaining a processed substrate within a substrate transfer cavity formed in a load lock chamber body for two venting cycles. In another embodiment, a method for transferring substrates includes transferring a substrate from a transfer cavity to a heating cavity formed in the load lock chamber body, and heating the substrate in the heating cavity.

In another embodiment, a load lock chamber is provided that includes a chamber body having a substrate support disposed in a substrate transfer cavity. The substrate support is movable between a first elevation and a second elevation. A plurality of grooves are formed in at least one of a ceiling or floor of the substrate transfer cavity and configured to receive at least a portion of the substrate support when located in the second elevation.

In yet another embodiment, a substrate processing system is provided that includes substrate transfer chamber having a substrate transfer robot disposed therein, one or more vacuum processing chambers coupled to the transfer chamber and a load lock chamber. The load lock chamber has a body that is coupled to the transfer chamber. The body of the load lock chamber includes first and second cooled transfer cavities and a heating cavity. Each of the cooled transfer cavities has a plurality of substrate storage slots.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

A load lock chamber suitable for efficient heating and cooling of large area substrates is provided. A method for utilizing the load lock chamber to transfer substrates between a vacuum environment, such as present in a transfer chamber, and an atmospheric environment, such as present in a factory interface, is also provided. Although specific embodiments of both load lock chambers and a method of transferring substrates are provided below with reference to a load lock chamber of a configuration available from Applied Materials, Inc., of Santa Clara, Calif., it is contemplated that the inventive features and methods may be adapted for use in other load lock systems, including those from other manufacturers.

Figure 1:
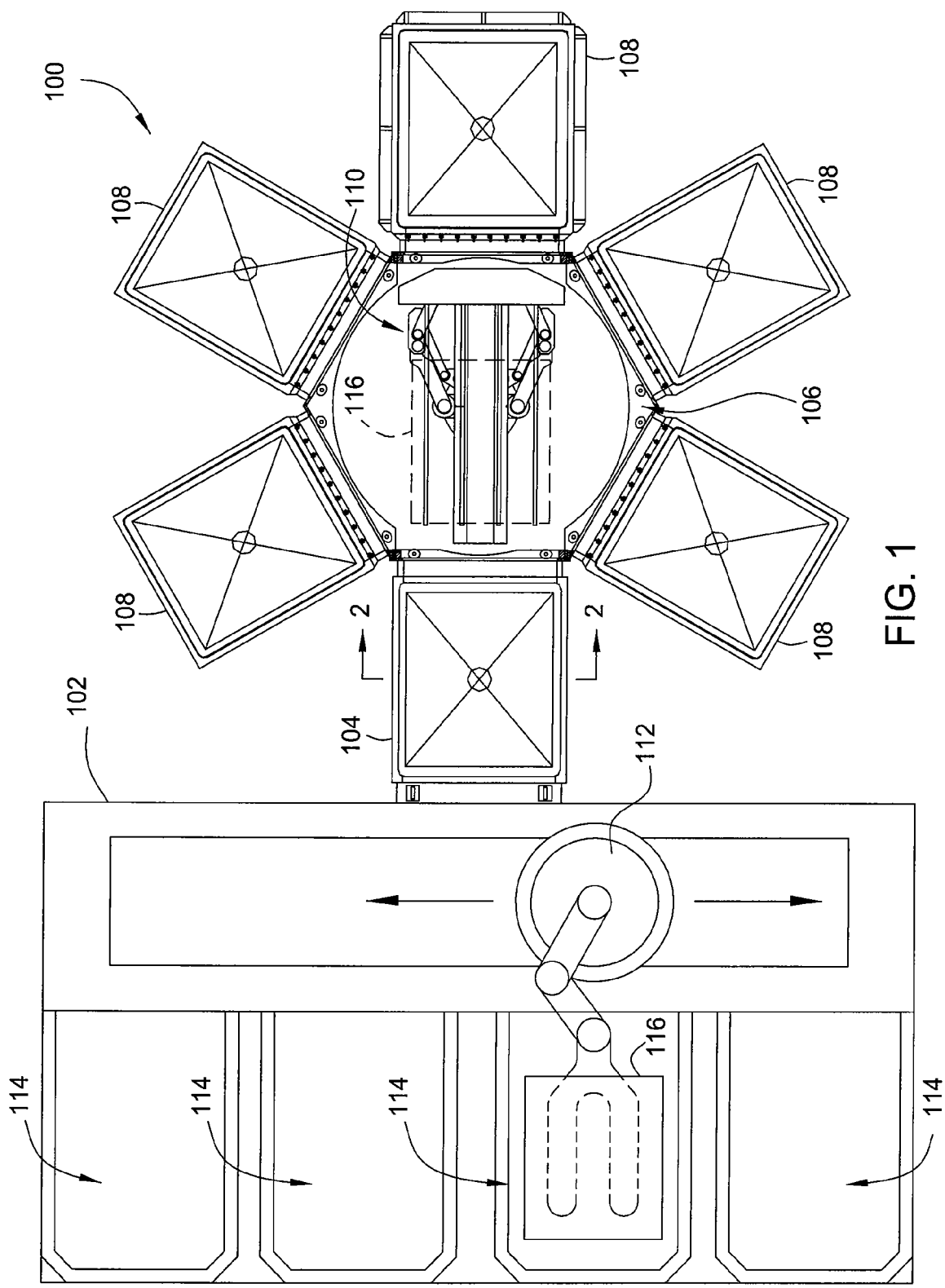
FIG. 1 is a plan view of an illustrative cluster tool having one embodiment of a load lock chamber of the present invention.

FIG. 1 is a plan view of an illustrative cluster tool 100 having one embodiment of a load lock chamber 104 of the present invention. The cluster tool 100 includes a factory interface 102 coupled by the load lock chamber 104 to a transfer chamber 106. The factory interface 102 generally includes a plurality of substrate storage cassettes 114 and an atmospheric robot 112. The atmospheric robot 112 facilitates transfer of substrates 116 between the cassettes 114 and the load lock chamber 104. A plurality of substrate processing chambers 108 are coupled to the transfer chamber 106. A vacuum robot 110 is disposed in the transfer chamber 106 to facilitate transfer of a substrate 116 between the load lock chamber 104 and the processing chambers 108.

The load lock chamber 104 generally includes a plurality of environmentally-isolatable cavities, each having one or more substrate storage slots defined therein. The load lock chamber 104 is operated to transfer substrates 116 between an ambient or atmospheric environment of the factory interface 102 and the vacuum environment maintained in the transfer chamber 106.

Figure 2:
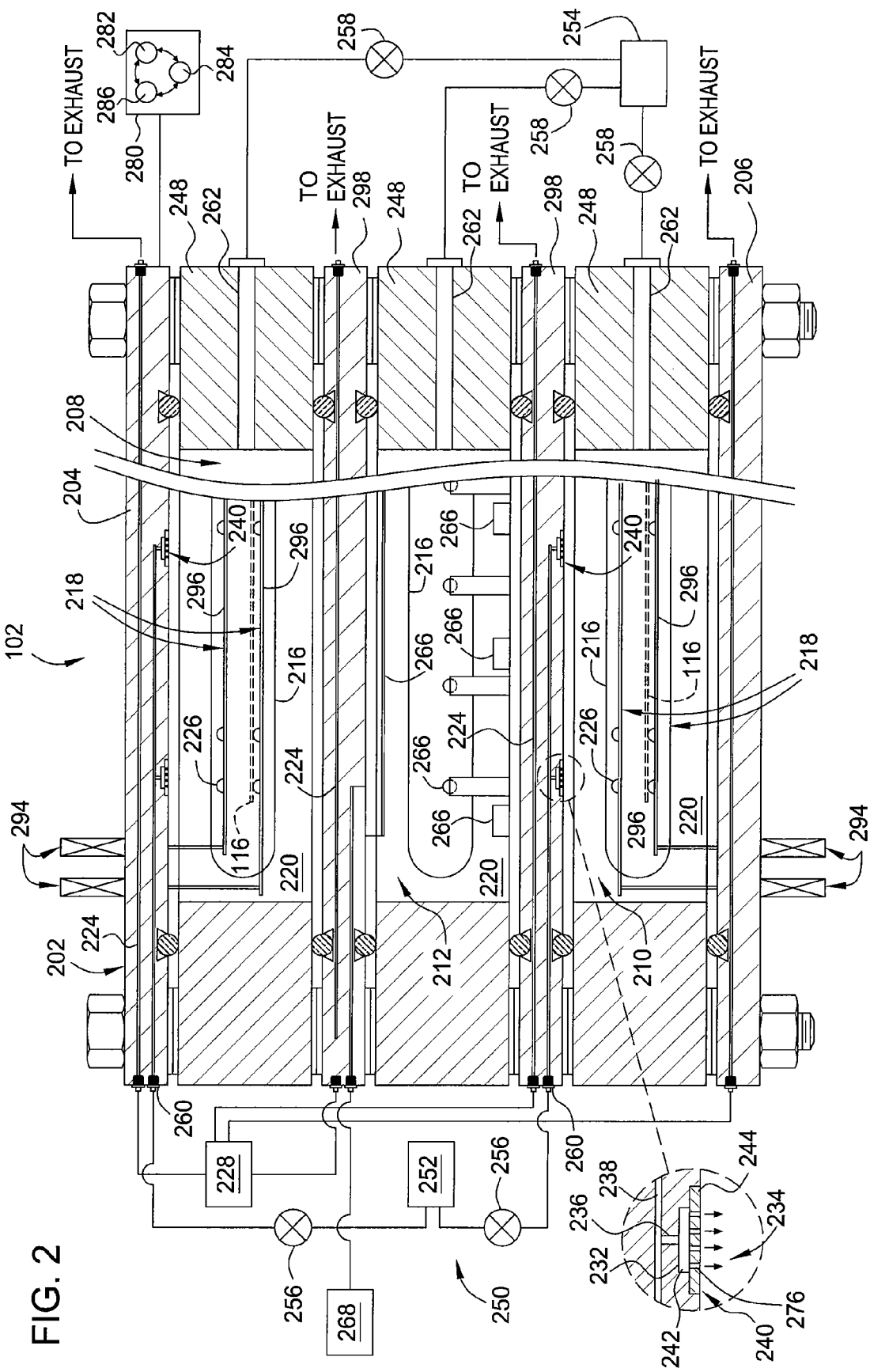
FIG. 2 is a sectional view of the load lock chamber taken along section line 2-2 of FIG. 1.

FIG. 2 depicts one embodiment of a load lock chamber 104 of the present invention. The load lock chamber 104 includes a body assembly 202 fabricated from a rigid material such as stainless steel, aluminum or other suitable material. The body assembly 202 may be fabricated from an assembly of components into a leak-free structure. One suitable body assembly that may be adapted to benefit from the invention is described in U.S. patent application Ser. No. 11/332,781, filed Jan. 13, 2006, which is incorporated by reference in its entirety. Alternatively, the body assembly 202 may have other configurations and/or be fabricated from a single block of material.

In one embodiment, the body assembly 202 includes a top plate 204 and a bottom plate 206 that sandwich a plurality of ring-shaped bodies 248. Interior plates 198 are disposed between the bodies 248. The plates 204, 206, 298 enclose internal volumes 220 defined inside each of the bodies 248. In the embodiment depicted in FIG. 2, the upper and lower internal volumes 220 are configured as substrate transfer cavities 208, 210, while the internal volume 220 bounded by the middle body 248 is configured as a heating cavity 212.

The top and bottom plates 204, 206 are sealingly coupled to the bodies 248 by a plurality of fasteners in a manner that permits relative movement between at least one of the top and bottom plates 204, 206 and the body 248. For example, at least one of the top and bottom plates 204, 206 are coupled to the body 248 without welding. In embodiments wherein force applied to the sidewalls from the plates 204, 206 is not of great concern, the top and bottom plates 204, 206 and the body 248 may be coupled by welding.

Figure 3:
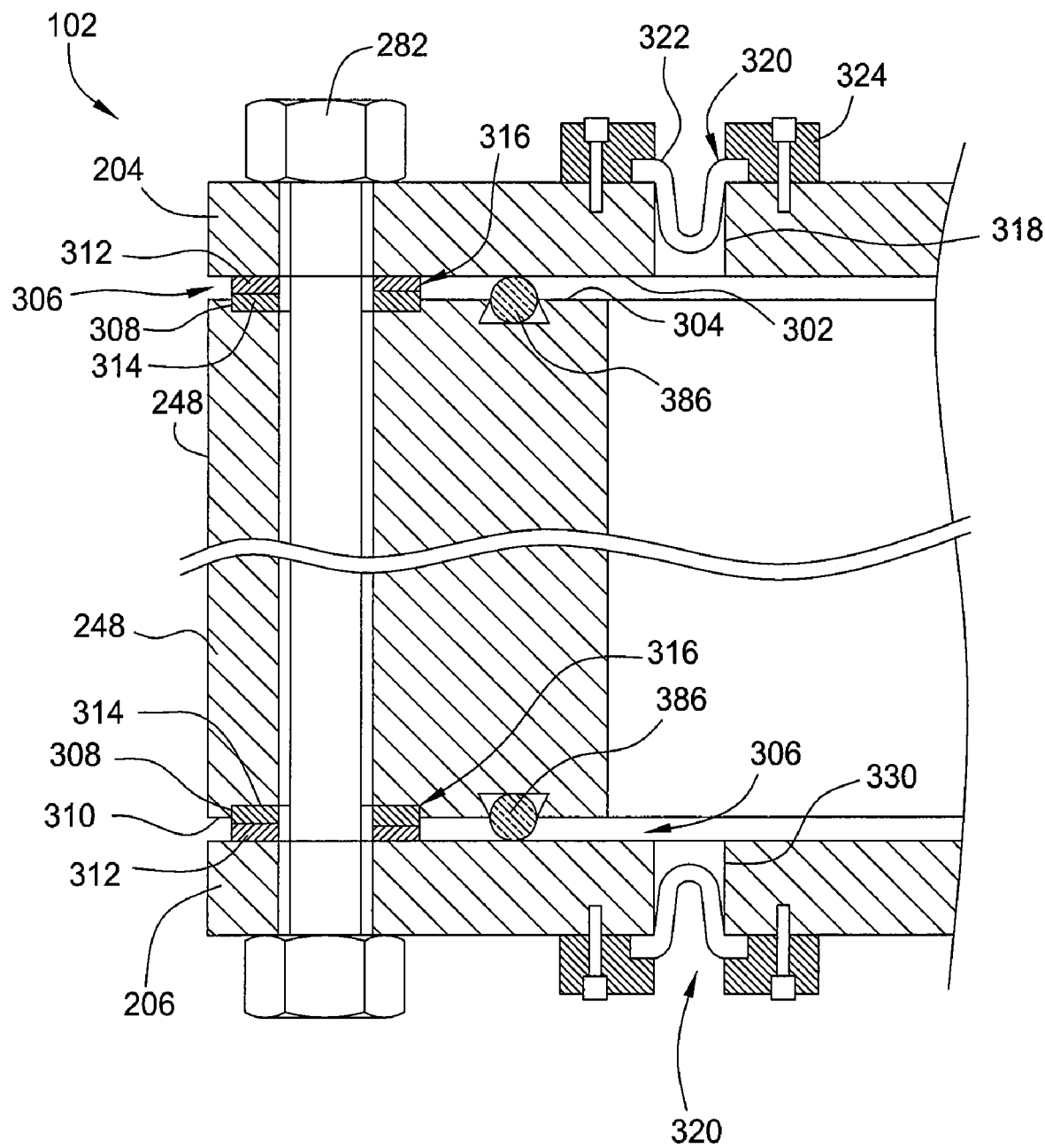
FIG. 3 is a partial sectional view of the load lock chamber of FIG. 1.

Referring additionally to a partial sectional view of the body assembly 202 depicted in FIG. 3, at least one spacer 316 is provided between a lower surface 302 of the top plate 204 and an upper surface 304 of the body 248. The spacer 316 separates the top plate 204 and chamber body 248, such that a gap 306 is defined therebetween. In one embodiment, the spacer 316 is a member having a plan area much smaller than the plan area of the upper surface 304 of the chamber body 248. For example, a plurality of spacers 316 may be disposed on upper surface 304 along one side of the chamber body 248.

The thickness of the spacer 316 is selected such that a gasket or o-ring 386 is adequately compressed to maintain a vacuum seal between the plates and body, while preventing the top plate 204 from contacting the chamber body 248 under vacuum or other stress conditions. Similarly, one or more spacers 316 are provided between the bottom plate 206 and the chamber body 248 to maintain a gap 306 therebetween.

In one embodiment, the body assembly 202 includes a top plate 204 and a bottom plate 206 that sandwich a plurality of ring-shaped bodies 248. Interior plates 298 are disposed between the bodies 248. The plates 204, 206, 298 enclose internal volumes 220 defined inside each of the bodies 248. In the embodiment depicted in FIG. 2, the upper and lower internal volumes 220 are configured as substrate transfer cavities 208, 210, while the internal volume 220 bounded by the middle body 248 is configured as a heating cavity 212.

In one embodiment, the spacers 312, 314 are disks. The disks may be washers disposed around the bolts 282 utilized to secure the body assembly 202 for ease of assembly. As the sliding components (e.g., the spacers 312, 314) have reduced contact area relative to the upper surface 304 of the body 248, the force necessary to begin motion is reduced. Additionally, as the contacting surface of the spacers 312, 314 are outward of the gasket 386, any particles generated during the sliding of the spacers 312, 314 are beneficially prevented from entering the internal volume 220 of the load lock chamber 104. It is contemplated that the spacers 316 may be in the form of a rib or other feature, extending between the plates and body to maintain a gap therebetween. It is also contemplated that the spacer may be incorporated into either the plates or body. It is contemplated that the spacers 316 may be in the form of a rib or other feature extending between the plates and body to maintain a gap therebetween. It is also contemplated that the spacer may be incorporated into either the plate or body (i.e., have unitary construction).

In the embodiment depicted in FIG. 3, a recess 308 is formed in the upper surface 304 of the body 248 to locate the second spacer 314. Optionally, a recess (not shown) may be formed in the top plate 204 to locate the first spacer 312. The recess (not shown) 308 has a depth selected, such that the spacer 314 extends beyond the upper surface 304 to ensure the first spacer 312 is free to slide laterally relative to the body 248.

To further minimize the effect of forces exerted on the top plate 204 of the load lock chamber 104, at least one slot 318 is formed therein. The slots 318 allow the central region of the top plate 204 to move, deflect and/or expand while minimizing the effect of motion on the edges of the top plate. A seal assembly 320 disposed in the slot 318 to prevent leakage into interior volume 220 of the load lock chamber 104. In the embodiment depicted in FIG. 3, the seal assembly 320 includes gasket or bellows 322 clamped to the top plate 204 by a clamp block 324. Similarly, the bottom plate 206 includes at least one slot 330 sealed by a seal assembly 320, as described above.

Returning back to FIG. 2, two substrate access ports 216 are formed through opposing sidewalls of the bodies 248 to allow entry and egress of substrates from the internal volume 220 of the substrate transfer cavities 208, 210. Only one of the ports 216 are shown in FIG. 2. The heating cavity 212 includes at least one substrate access port 216 defined on a side of the body 248 that is coupled to the transfer chamber 106 so that the interior volume 220 of the transfer cavity 212 may be accessed by the vacuum robot 110 (shown in FIG. 1). The substrate access ports 216 are selectively sealed by slit valve doors, which are well known in the art. One slit valve door that may be adapted to benefit from the invention is described in U.S. patent application Ser. No. 10/867,100, entitled CURVED SLIT VALVE DOOR, filed Jun. 14, 2004 by Tanase, et al., and is incorporated by reference in its entirety.

The heating cavity 212 may optionally have a second substrate access port (not shown in FIG. 2). The second substrate access port may be selectively sealed by a slit valve door, or alternatively sealed by a blank plate since the substrate access port is primarily used for cavity maintenance.

In one embodiment, at least one of the plates 204, 206, 298 may be configured as a temperature regulating plate. One or more passages 224 may be formed in the plates 204, 206, 298 and coupled to a fluid source 228. The fluid source 228 provides a heat transfer fluid that is circulated through the passages 142 to regulate (i.e., heat and/or cool) the temperature of the plates 204, 206, 298 and ultimately, the temperature of the substrate 116. By cooling the plates 204, 206, 298, hot substrates returning from processing may be effectively cooled without utilizing a separate conventional cooling plate disposed within the cavities 208, 210.

The heating cavity 212 generally includes one or more heaters 266 disposed in the internal volume 220 that are to selectively heat the substrate 116. In the embodiment depicted in FIG. 2, a plurality of heaters 266 are coupled to at least one of the surfaces of the interior plates 298 facing the substrate 116 disposed in the heating cavity 212. The heaters 266 may be lamps, resistive heating elements or other suitable heating device. The position of the heaters 266 above and below the substrate 116 facilitates rapid radiant heating of the substrate. The heaters 266 are independently coupled to a power source 268. This configuration allows each heater 266 to be independently controlled so that the temperature profile of the substrate 116 may be tailored as desired, for example, by uniformity heating and/or by heating one region of the substrate faster than a second region. In the embodiment depicted in FIG. 2, the heaters 266 are arranged to allow the center of the substrate 116 to be heated at a rate different than the perimeter of the substrate.

Figure 4A:
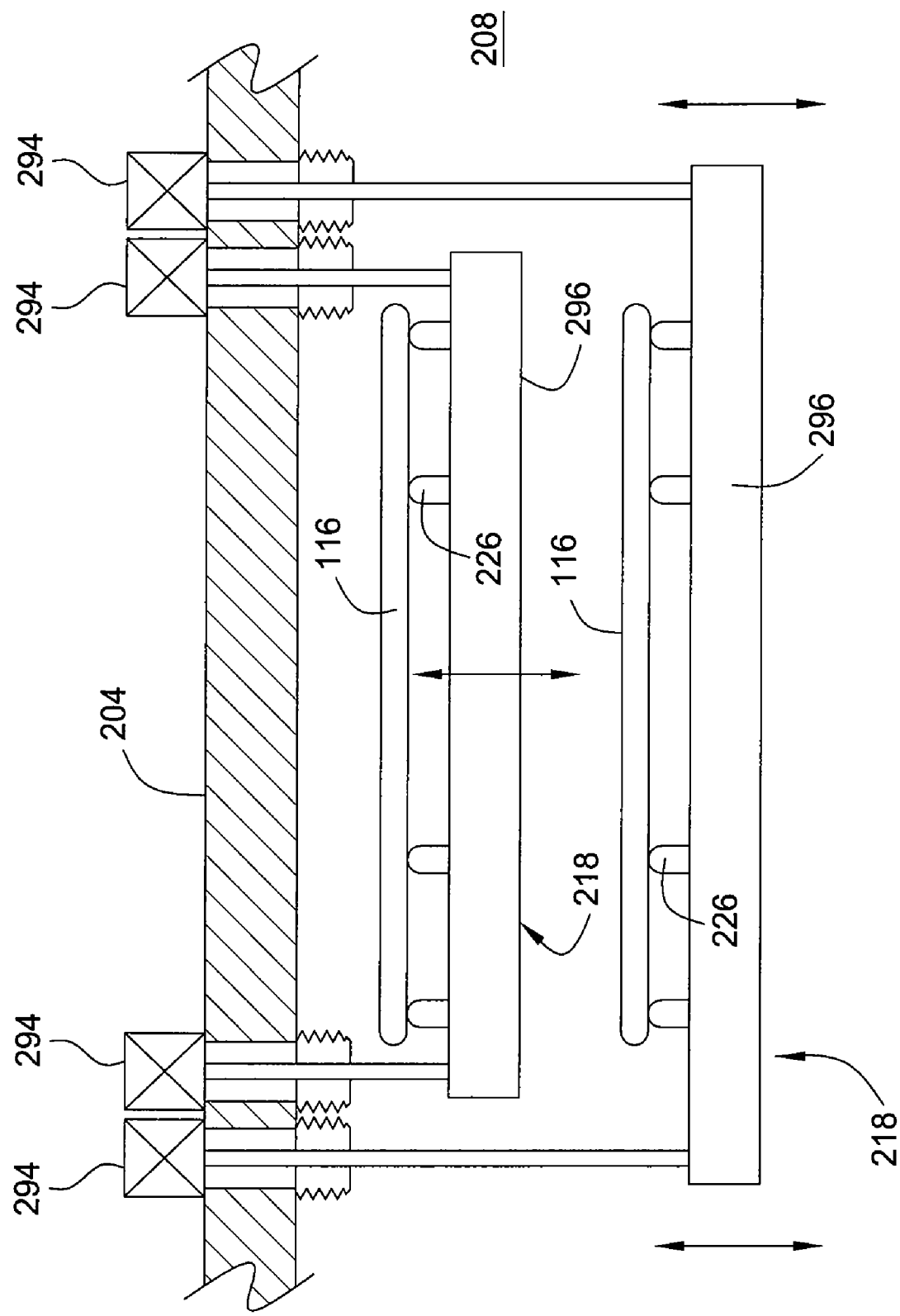
FIG. 4A is another partial sectional view of the load lock chamber of FIG. 1.

Referring to FIGS. 2 and 4A, a plurality of substrate support structures 218 are disposed in the internal volumes 220 of the transfer cavities 208, 210. The substrate support structures 218 are generally configured to each support a single substrate. The elevation of the support structures 218 is selectively controlled such that the proximity of substrate to the cooled plates (or heaters 266) may be selectively adjusted. The elevation of the support structures 218 may also be controlled to facilitate substrate exchange through the ports 216. In one embodiment, each substrate support 218 is coupled to one or more actuators 294 so that the elevation of the respective supports 218 within each cavity may be independently controlled. It is contemplated that other substrate support structures may alternatively be used.

In one embodiment, the substrate support structure 218 includes a plate or plurality of bars 296 coupled to the actuators 294. The bars 296 are configured to span beyond the underside of the substrate supported thereon to facilitate coupling of the bar to the actuator 294.

A plurality of pins 226 may extend from the bars 296 to support the substrate 116 thereon. The ends of the pins 226 supporting the substrate 116 may be rounded and/or include a ball to reduce dynamic friction between the bottom surface of the substrate 116 and the pins 226 and to prevent substrate scratching. In the embodiment depicted in FIG. 2, a ball is disposed at a distal end of each pin 226. The reduced friction provided by the balls allows the substrate to readily expand and contract while supported on the pins 226 without scratching the substrate. Other suitable substrate supports are described in U.S. Pat. No. 6,528,767, filed Mar. 5, 2003; U.S. patent application Ser. No. 09/982,406, filed Oct. 27, 2001; and U.S. Patent Application No. 60/376,857, filed Feb. 27, 2003, all of which are incorporated by reference in their entireties. The pins 226 are generally arranged to facilitate substrate exchange with a robotic end effector. Pins 226 are additionally coupled to the interior plate 298 forming the floor of the heating cavity 212 to support a substrate therein.

To enhance heat transfer between the substrate and the chamber body 248, the substrate supports 218 may move the substrate support thereon proximate the floor (or ceiling) of the transfer cavities 208, 210. The distance between the substrate and transfer cavity floor/ceiling may be adjusted based on the temperature of the substrate. For example, hot substrate returning from pressing may have temperatures in excess of 240 degrees Celsius. To prevent condensation and/or thermal stress for forming, the hot substrate may be maintained at a large distance from the transfer cavity floor/ceiling. Once the hot substrate has been sufficiently cooled, for example to about 140 degrees Celsius, the cooler substrate may be moved closer to the transfer cavity floor/ceiling to increase the heat transfer efficiency, thereby allowing cooler substrate temperatures to be obtained at a faster rate, which also enhances substrate throughput.

To further enhance heat transfer between the substrate and the floor/ceiling of the transfer cavities 208, 210, the substrate supports 218 may be configured to interfit with the floor and/or ceiling of the transfer cavity. This allows the distance between the substrate and chamber body assembly 202 to be minimized, and in some embodiments, to place the substrate in contact with the chamber body assembly 202 to take full advantage of thermal exchange with the heat transfer fluid running through the passages 224.

Figure 5:
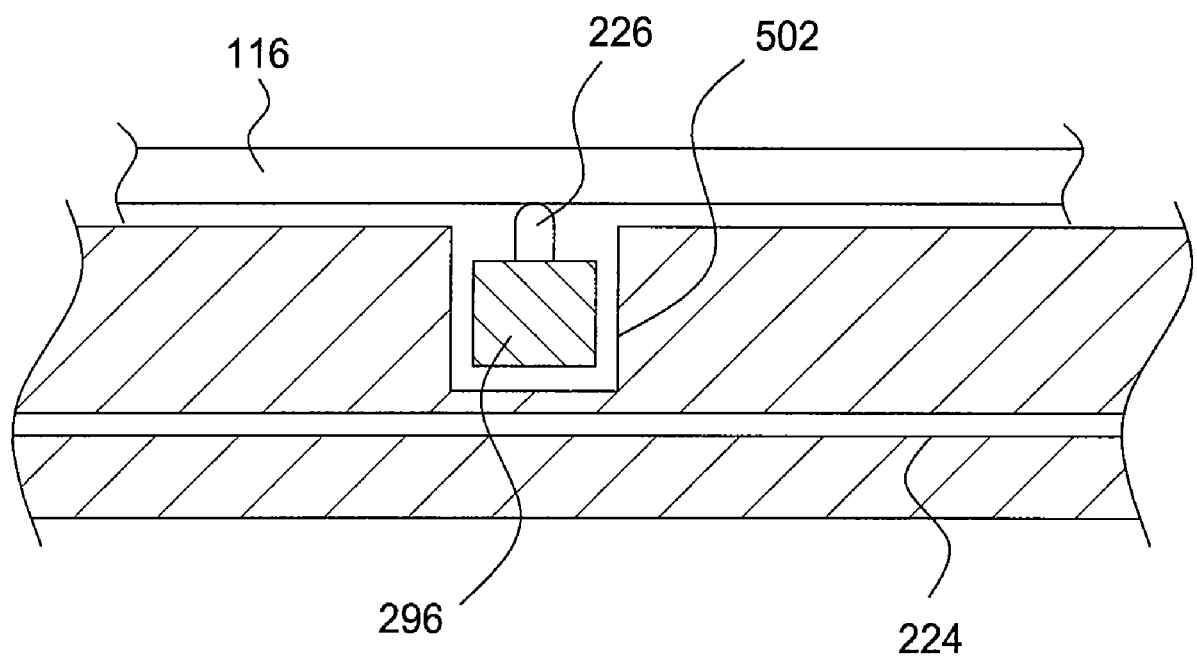
FIG. 5 is another partial sectional view of the load lock chamber of FIG. 1.

FIG. 5 depicts a sectional view of one embodiment of the interior plate 298 configured to interfit with the substrate support 218. The plate 298 includes slots 502 (one is shown in FIG. 5) that are configured to allow the bar 296 of the substrate support 218 to be moved therein. In one embodiment, the depth of the slot 502 may be selected to allow the substrate to be lifted from the pins 226 by the plate 298 as the bar 296 moves to the bottom of the slot 502. Alternatively, the slot 502, or motion of the bar 296, may be configured to maintain the substrate 116, supported on the pins 226, in close proximately to the plate such the substrate is efficiently cooled by the fluid circulating through the passages 224. The second transfer cavity 210 is similarly configured with slots 502 formed in the lower portion of the bounding internal plate 298.

Figure 4B:
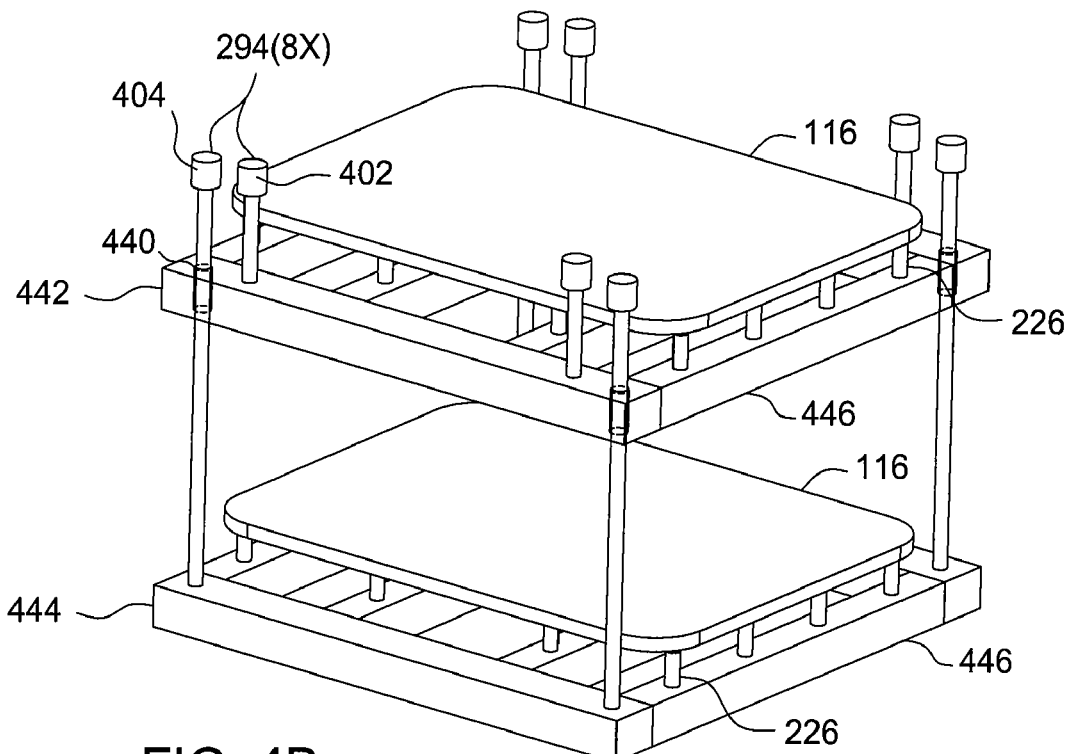
FIG. 4B is a partial isometric view of another embodiment of an interior of a load lock chamber.
Figure 4C:
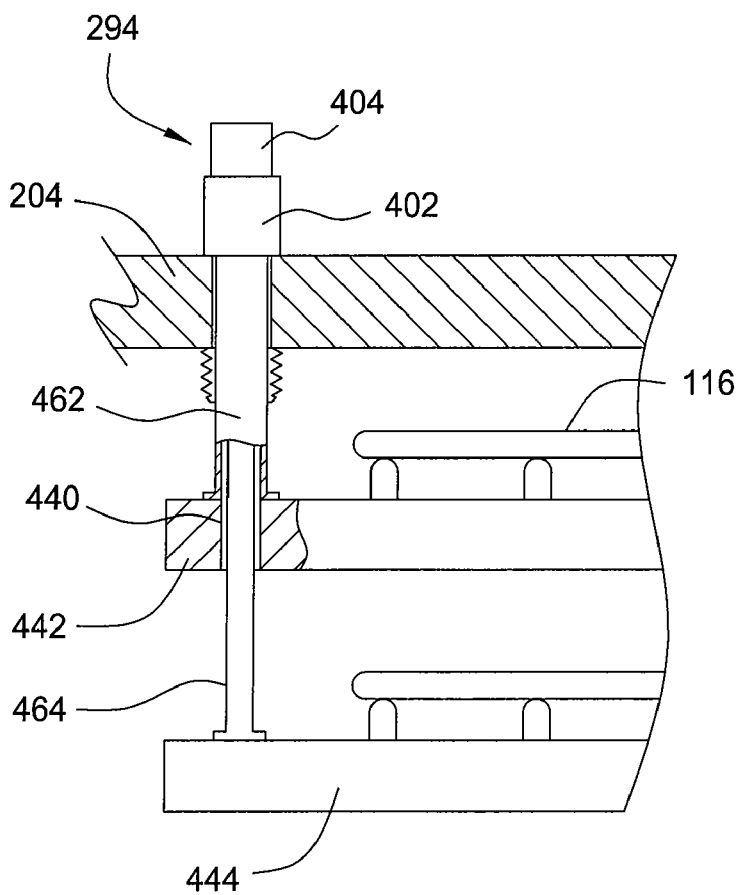
FIG. 4C is a partial sectional view of another embodiment of an interior of a load lock chamber.

FIG. 4B is a partial isometric view of another embodiment of an interior of the load lock chamber. In the embodiment depicted in FIG. 4B, the actuator 404 which controls the elevation of the lower substrate support 444 passes through a feature 440 formed in the upper substrate support 442, thereby enabling the actuators 402, 406 to be aligned. Thus, the substrate supports 442, 444 may be configured to have the same projected surface area (e.g., footprint) within the interior volume of the load lock chamber, thereby enabling the walls of the load lock chamber body to be disposed closer to the substrate supports 442, 444, which reduces the interior volume of the load lock chamber beneficially resulting in lower pumping and venting times. In the embodiment depicted in FIG. 4B, the feature 440 is a hole formed through the upper substrate support 442. It is contemplated that the feature 440 may alternatively be a notch, a groove, a slot, cut-out or other geometric disparity between the upper and lower substrate supports 442, 444 which enable the actuator 402 controlling the elevation of the lower substrate support 444 to be coupled to the lower support plate 444 without obstruction by upper substrate support 442. It is also contemplated that pairs of the actuators 402, 404 may be concentrically aligned, with the actuation rod 464 of the lower actuator telescoping through the rod 462 of the upper actuator 402 and the feature 440 of the upper substrate support 442, as shown in FIG. 4C.

Returning again to FIG. 2, a pressure control system 250 is coupled to the load lock chamber 104 to control the pressure within the internal volumes 220 of the body assembly 202. The pressure control system 250 generally includes a gas source 252 and an exhaust system 254. The gas source 252 is coupled to at least one inlet port 260 formed through the chamber body assembly 202. The gas source 252 provides a vent gas utilized to raise and/or regulate pressure within the internal volume 220 of the chamber body assembly 202. For example, the gas source 252 may flow vent gas into the internal volumes 220 of the transfer cavities 208, 210 to facilitate transfer of the substrate 116 from a vacuum environment to an ambient environment. In one embodiment, the vent gas comprises at least one of nitrogen, helium, air or other suitable gas. Optionally, the heating cavity 212 may not include an inlet port as, in one embodiment, the cavity 212 may be constantly maintained at operational vacuum pressure.

An inlet control valve 256 is disposed between the gas source 252 and the inlet port 260 to selectively control the flow of vent gases into the internal volumes 220 of the body assembly 202. The inlet control valve 256 is capable of providing a substantially leak-tight seal under vacuum conditions. In one embodiment, the gas source 252 is configured to control the attributes of the vent gas, such as the flow rate, temperature and/or humidity of the vent gas.

In the embodiment depicted in FIG. 2, the inlet port 260 is coupled to one or more diffusers 240 by a vent passage 238. The diffusers 240 are formed in an interior side of the top plate 204 (or other plate), such that gas flowing into the internal volume 220 is directed toward the top of the substrate 116. This arrangement beneficially assists in cooling the substrate 116 while venting the load lock chamber 104 after processing the substrate 116.

In one embodiment, the diffuser 240 is formed in a recess 232 defined in the bottom surface of the plates 204, 298. A cap 244 covers the recess 232 to define a plenum 242 in the plates. A connecting hole 236 fluidly couples the plenum 242 to the vent passage 238. A plurality of apertures 276 are formed through the cap 244 to allow vent gases to flow from the gas source 252 through plenum 242 and into the interior volume 220, as illustrated by arrows 234. Although the diffusers 240 are primarily intended to direct venting gases into the load lock chamber 104, it is contemplated that the diffusers 240 may also be utilized to evacuate the internal volume 220 of the chamber 104.

The exhaust system 254 is generally coupled to at least one exhaust port 262 formed through the chamber body assembly 202. The exhaust system 254 is configured to remove gases from the internal volume 220 of the load lock chamber 104. The exhaust system 254 may include one or more vacuum pumps (not shown) and may be ultimately coupled to the facilities exhaust system (also not shown). For example, the exhaust system 254 may pump out gas from the internal volume 220 to facilitate transfer of the substrate 116 from an ambient environment to a vacuum environment.

An exhaust control valve 258 is disposed between the exhaust system 254 and the exhaust port 262 to selectively control the flow of gases exiting the internal volume 220 of the body assembly 202. The exhaust control valve 258 is typically similar to the inlet control valve 256 and is capable of providing a substantially leak-tight seal under vacuum conditions.

A controller 280 is coupled to the load lock chamber 104 to control the operation thereof. The controller 280 includes a central processing unit (CPU) 282, support circuits 286 and memory 284. The CPU 282 may be one of any form of computer processor that can be used in an industrial setting for controlling various chambers and subprocessors. The support circuits 286 are coupled to the CPU 282 for supporting the processor in a conventional manner. These circuits include cache power supplies, clock circuits, input/output circuitry, subsystems, and the like. The memory 284 is coupled to the CPU 282. The memory 284, or computer-readable medium, may be one or more of readily available memory such as random access memory (RAM), read only memory (ROM), floppy disk, hard disk, or any other form of digital storage, local or remote.

A method, for example one of the substrate transfer methods described below, is generally stored in the memory 284, typically as a software routine. The software routine may also be stored and/or executed by a second CPU (not shown) that is remotely located from the hardware being controlled by the CPU 282.

Although the method of the present invention is discussed as being implemented as a software routine, some of the method steps that are disclosed herein may be performed in hardware as well as by the software controller. As such, the invention may be implemented in software as executed upon a computer system, in hardware as an application specific integrated circuit or other type of hardware implementation, or a combination of software and hardware.

Figure 6:
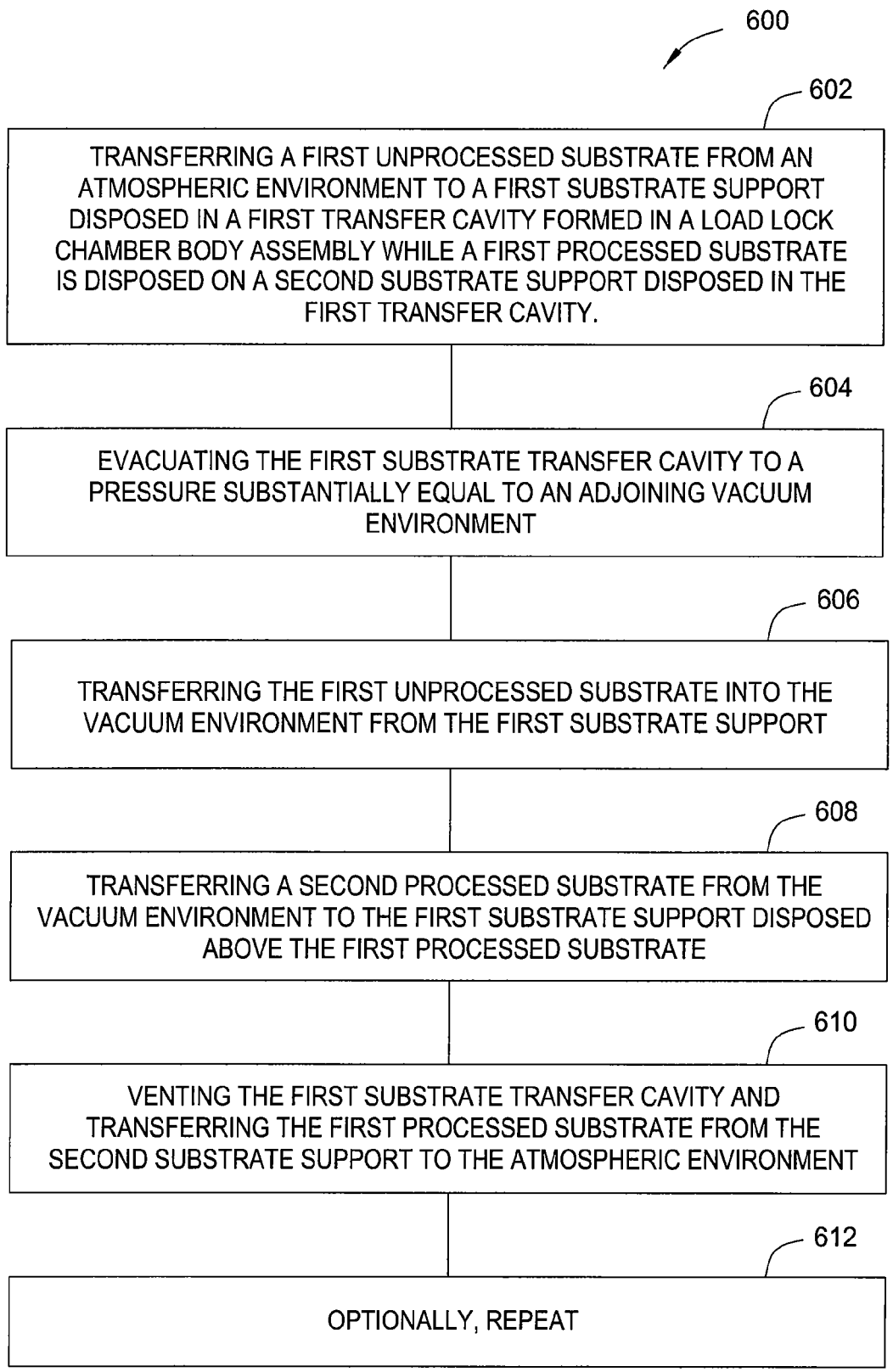
FIG. 6 is a flow diagram of one embodiment of a method for transferring substrate between an atmospheric environment and a vacuum environment.

FIG. 6 is a flow diagram of one embodiment of a method 600 for transferring substrates between an atmospheric environment and a vacuum environment. The method 600 may be stored in memory 284, executed by the controller 280, and be practiced utilizing the load lock chamber 104 described herein. It is also contemplated that the method 600 may be practiced in other suitably adapted load lock chambers.

The method 600 begins at step 602 by transferring a first unprocessed substrate from an atmospheric environment (e.g., the factory interface 102) to the first substrate support 218 disposed in the first transfer cavity 208 formed in the load lock chamber body assembly 202. The first transfer cavity 208 additionally has a first processed substrate positioned therein on the second substrate support 218. At step 604, the first substrate transfer cavity is evacuated to a pressure substantially equal to an adjoining vacuum environment (e.g., the transfer chamber 106). During the evacuation step 604, the first processed substrate may be cooled. In one embodiment, the first processed substrate may be cooled by moving the substrate to a position very close and/or touching the floor of the first substrate transfer cavity. As the floor of the first substrate cavity has a cooling fluid circulating in a passage 224 formed therein, the first processed substrate is efficiently and rapidly cooled.

At step 606, the first unprocessed substrate is transferred into the vacuum environment from the first substrate support. At step 608, a second processed substrate is transferred from the vacuum environment to the first substrate support disposed above the first processed substrate.

The method may continue at step 610 by venting the first substrate transfer cavity and transferring the first processed substrate from the second substrate support to the atmospheric environment (e.g., the factory interface 102). At step 612, steps 602 through 610 may be repeated to move additional substrates between the atmospheric and vacuum environments. Notably, the method 600 requires hot substrates returning to the factory interface from the transfer chamber to be maintained in the load lock chamber through at least two venting cycles. This facilitates fast delivery of unprocessed substrates into the transfer chamber while allowing extended time in the load lock chamber for processed substrates to ensure uniform cooling without undue generation of thermal stresses, condensation or other defect.

Moreover, in order to minimize creation of thermal gradients during cooling and/or condensation on the processed substrate, the processed substrate may be maintained in a first position relative to the floor (or ceiling) of the substrate transfer cavity during the first transfer cycle while the substrate is at an elevated temperature, then moved to a second elevation closer to the floor (or ceiling) of the transfer cavity during the second transfer cycle when the substrate is at a much cooler temperature. For example, the substrate may be cooled from about 250 degrees Celsius to about 140 degrees Celsius during the first transfer cycle while being relatively spaced from the cavity flood and/or ceiling. Once at a lower temperature, the substrate may be cooled to a temperature below 140 degrees Celsius during the second transfer cycle by moving the substrate to a position relatively closer or in contact with the cooled floor (or ceiling) of the load lock chamber body.

Figure 7:
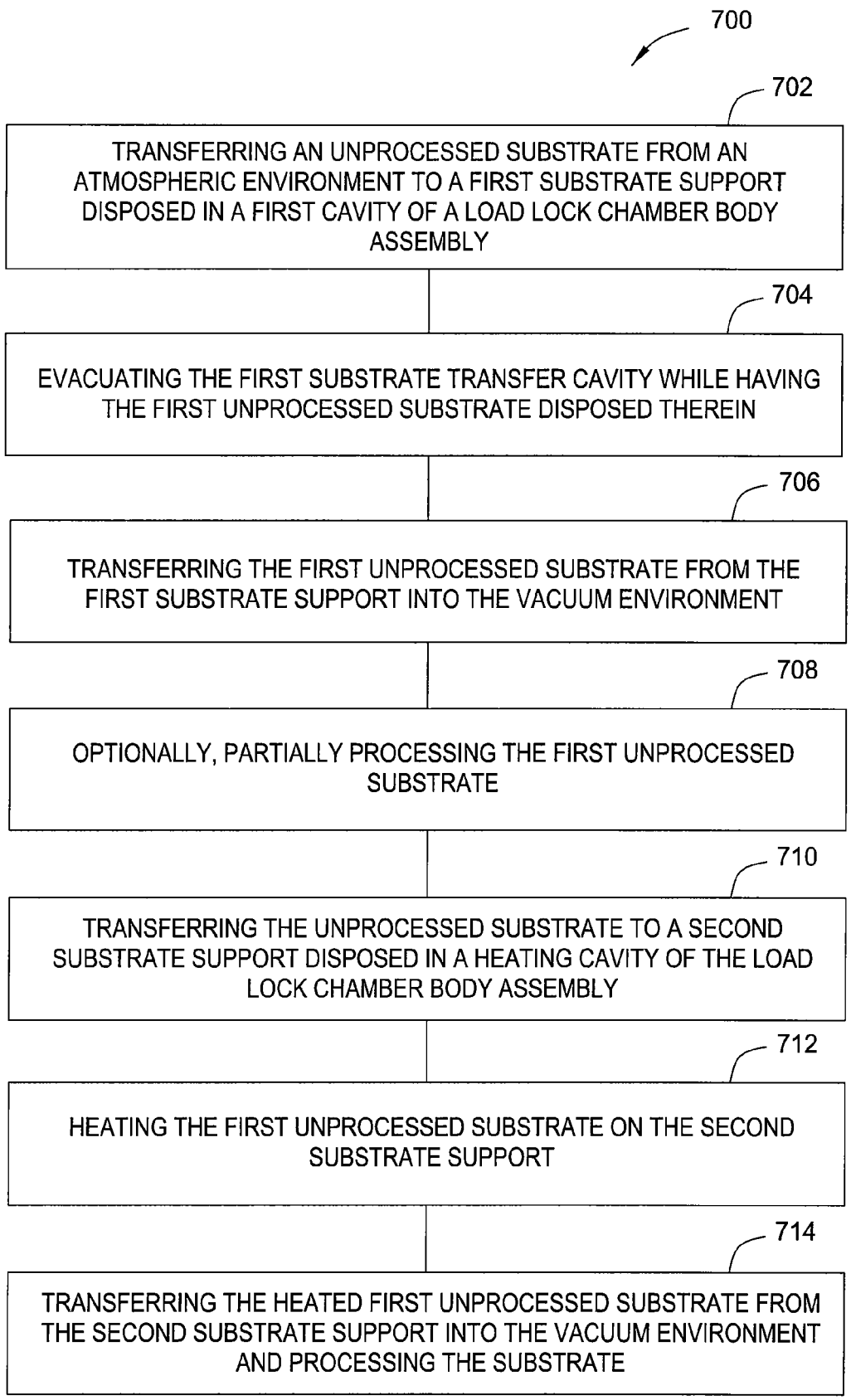
FIG. 7 is another embodiment of a flow diagram of one embodiment of a method for transferring substrates between an atmospheric environment and a vacuum environment.

FIG. 7 is a flow diagram of another embodiment of a method 700 for transferring substrates between an atmospheric environment and a vacuum environment. In one embodiment, the method 700 begins at step 702 by transferring an unprocessed substrate from an atmospheric environment to a first substrate support disposed in the first transfer cavity 208 of a load lock chamber body assembly 202. At step 702, the first substrate transfer cavity is evacuated while having the first unprocessed substrate disposed therein. At step 706, the first unprocessed substrate is transferred from the first substrate support into the vacuum environment. At step 708, the unprocessed substrate is transferred to a second substrate support disposed in a heating cavity 212 of the load lock chamber body assembly 202. At step 708, the unprocessed substrate may optionally have one or more processes performed prior to transfer to the heated cavity 212. At step 710, the first unprocessed substrate is heated in the heated cavity 212. The method continues at step 712 by transferring the heated first unprocessed substrate from the second substrate support disposed in the heated cavity 212 to the vacuum environment and processing the substrate.

At step 710, the substrate may be heated using radiant heaters, such as lamps and/or a resistively heated plate. The heating may occur while the heating cavity 212 is maintained in a vacuum condition. Alternatively, the heating cavity 212 may be isolated from the vacuum environment and filled with a heat transfer medium such as nitrogen and/or helium to further enhance heat transfer to the first unprocessed substrate.

Figure 8:
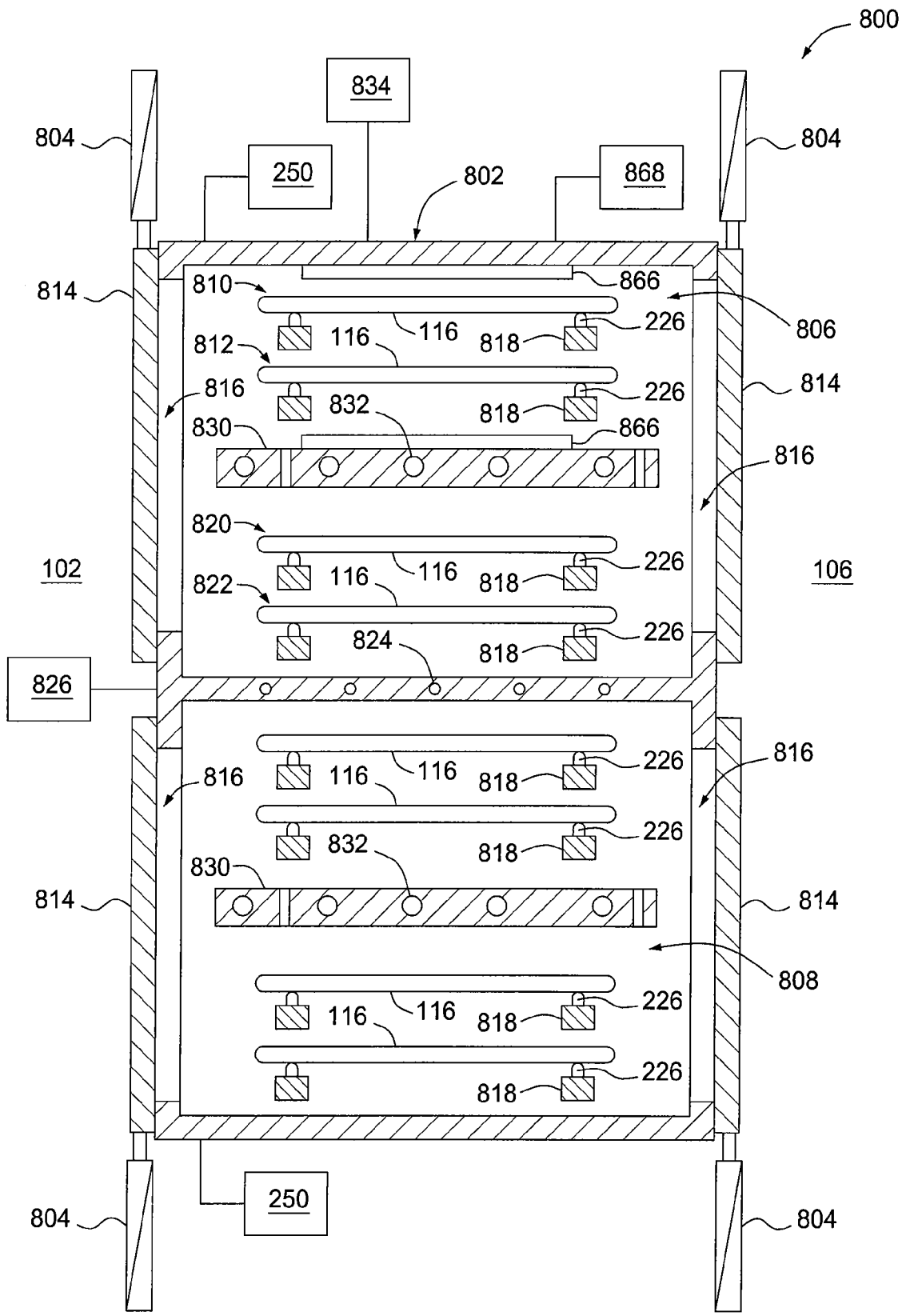
FIG. 8 is a side sectional view of another embodiment of a multiple chamber load lock chamber.

FIG. 8 is another embodiment of a load lock chamber 800. The load lock chamber 800 includes a body 802 having an upper transfer cavity 806 and a lower transfer cavity 808 defined therein. The construction of the chamber body 802 may be similar to the chamber body assembly 202 described above.

The upper transfer cavity 806 generally has four substrate transfer slots 810, 812, 820, 822 defined therein. Each substrate transfer slot is defined by a substrate support 818 which includes a plurality of pins 226 for supporting one substrate 116 thereon. An isolation plate 830 is disposed between the second substrate transfer slot 812 and the third substrate transfer slot 820 to bifurcate the upper transfer cavity 806 into cooling and heating regions. The heating region generally includes the first and second substrate transfer slots 810, 812, while the cooling region generally includes the third and fourth substrate transfer slots 820, 822 positioned therein.

The isolation plate 830 includes channels 832 coupled to a heat transfer fluid source 834. The fluid source 834 circulates a heat transfer fluid through the isolation plate 830 to maintain the plate 830 at a predefined temperature. Moreover, the heat transfer fluid flowing through the channels 832 allows the heat transfer plate 830 to substantially minimize thermal crosstalk between the heating and cooling regions defined on either side of the isolation plate 830 within the upper transfer cavity 806.

Substrates supported in the heating region of the upper transfer cavity 806 are heated by on or more heaters 866. The heater 866 is disposed on at least one of the ceiling or floor of the upper transfer cavity 806. The heater 866 may be a resistive heating element or lamp. The heaters 866 are coupled to a source 868 such that the thermal energy provided by the heaters 866 may be controlled as discussed above.

Substrates supported in the cooling region of the upper transfer cavity 806 are cooled by the isolation plate 830 and/or a thermally regulated interior wall 828 which separates the upper and lower transfer cavities 806, 808. The wall 828 generally includes one or more passages 824 through which a heat transfer fluid provided by a source 826 is circulated. It is contemplated that the cooling region may be defined above the isolation plate 830 while the heating region is defined below the isolation plate 830. The heat transfer cavity 808 is similarly constructed.

A pressure regulating system 250 is provided to control the pressure within the transfer cavities 808, 806 as described above. Each cavity 806, 808 includes one substrate access port 816 facing the factory interface 102 and a single second substrate access port 816 facing the transfer chamber 106. Thus, each of the substrate storage slots 810, 812, 820, 822 defined in the transfer cavities 806, 808 may be robotically accessed through a single port 816. Each substrate access port is selectively sealed by a single valve door 814 that is selectively opened and closed by an actuator 804. The slit valve doors 814 may be constructed as described above.

Figure 9:
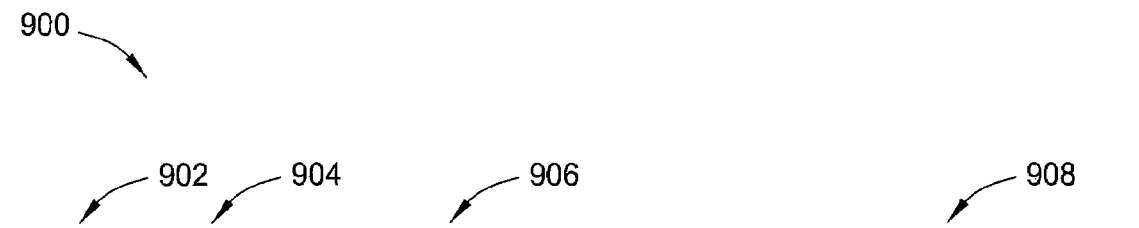
FIG. 9 is a flow diagram of another embodiment of a method for transferring substrates between an atmospheric environment and a vacuum environment.

FIG. 9 is a flow diagram of another embodiment of a method 900 for transferring substrates between an atmospheric environment and a vacuum environment. The method 900 is described with reference to the load lock chamber 800, but may also be practiced on other load lock chambers.

Column 902 of the method 900 illustrates the sequential time between each step of the method 900. It is noted that the time is arbitrary and merely representative of relative time required for each step. The time required for each step is dependent upon the size of the substrate, the volume being evacuated and vented and the heat transfer efficiency of the chamber. Column 904 indicates the pressure status of the transfer cavity of the load lock chamber. In the method 900, flow through the upper transfer cavity of the processing of the load lock chamber 800 is described. A similar process may be performed in the lower transfer cavity. It is also contemplated that embodiments of the method 900 may also be performed in other load lock chambers.

Column 906 describes the actions taken at each time step for substrates disposed in slots 1 and 2 of the upper transfer cavity. Column 908 describes the action taken for the substrates disposed in slots 3 and 4 of the upper substrate transfer cavity.

Figure 10:
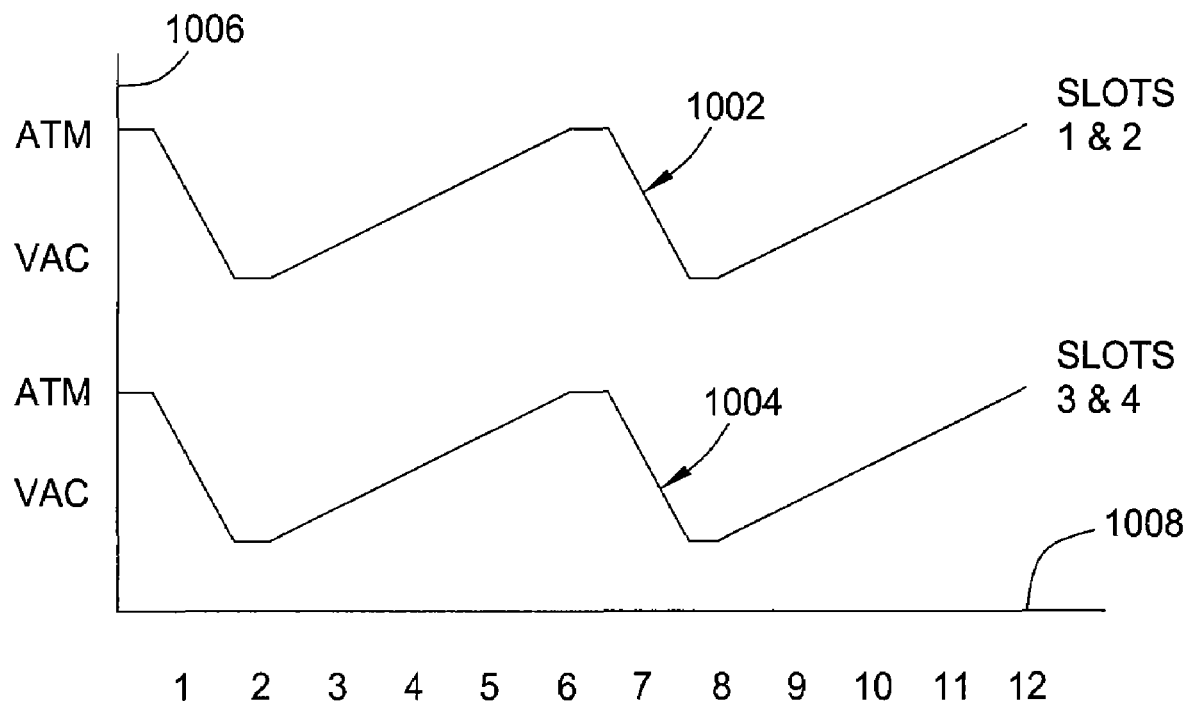
FIG. 10 is a graph illustrating the vacuum condition of one cavity of the load lock chamber of FIG. 8 having the method of FIG. 9 practiced therein.

FIG. 10 depicts a graph illustrating a vacuum condition of the upper transfer cavity of the load lock chamber 800 of FIG. 8 during different stages of the method 900 for transferring substrates between an atmospheric environment and a vacuum environment. Vertical axis 1006 depicts pressure while horizontal axis 1008 depicts time. Trace 1002 is representative of the pressure within the slots 1 and 2 while trace 1004 is representative of the pressure within slots 3 and 4.

The method begins at time zero where the cavity is at atmospheric pressure. Two cool substrates are removed from slots 1 and 2 and replaced with two new substrates from the factory interface 102 by the atmospheric robot 112. Two processed substrates (i.e., returning from processing in one or more of the processing chambers 108) remain in slots 3 and 4 to undergo cooling. At time 0:30, the upper transfer cavity is pumped down to vacuum. The two new substrates disposed in slots 1 and 2 are heated while the two substrates disposed in slots 3 and 4 continue to be cooled. At time 1:30, the upper transfer cavity is at vacuum and the slit valve door is opened to the transfer chamber. The heated substrates disposed in slots 1 and 2 are exchanged with process substrates by the vacuum robot 110. The two processed substrates disposed in slots 3 and 4 continue to be cooled. Thus, at this time, slots 1-4 have processed substrates disposed therein.

At time 2:00, the upper transfer cavity is sealed from the transfer chamber and vented to atmosphere. The two process substrates disposed in slots 1 and 2 are cooled while the two substrates in slots 3 and 4 continue cooling. At time 6:00, the upper transfer cavity is at atmospheric pressure, and the slit valve door is opened such that the upper transfer cavity is accessible to the atmospheric robot 112. The two substrates disposed in slots 1 and 2 continue to be cooled while the two cooled substrates disposed in slots 3 and 4 are removed by the atmospheric robot and replaced with two new substrates obtained from the cassettes 114.

At time 6:30, the upper transfer cavity is pumped down to vacuum. The two substrates disposed in slots 1 and 2 continue to be cooled while the two new substrates disposed in slots 3 and 4 are heated. At time 7:30, the upper transfer cavity is at vacuum, and the slit valve door separating the load lock chamber separating the upper transfer cavity from the transfer chamber is opened. The two substrates disposed in slots 1 and 2 continue to be cooled while the heated substrates disposed in slots 3 and 4 are exchanged with process substrates by the vacuum robot. Thus, at this time, slots 1-4 have processed substrates disposed therein.

At time 8:00, the upper transfer cavity is vented to atmosphere. The two substrates disposed in slots 1 and 2 continue cooling while the two substrates disposed in slots 3 and 4 begin cooling. At time 12:00, the upper transfer cavity is at atmospheric pressure, and the slit valve door separating the upper transfer cavity from the factory interface is be opened allowing the process to begin again.

Thus, a load lock chamber and method for transferring substrate between vacuum and ambient environment are provided. Double cycle cooling allows the substrate to be cooled at a rate that prevents thermal stress. Heating and cooling the substrates in separate chambers beneficially promote temperature uniformity by minimizing and isolating sources of thermal contamination. Moreover, since the venting cycle is comparatively long relative to the pump down cycle, the heating and cooling events and time are new decoupled since they are performed in separate chambers, which add process flexibility and enables targeted optimization of heating and cooling processes.

While the foregoing is directed to the preferred embodiment of the present invention, other and further embodiments of the invention may be devised without departing from the basic scope thereof. The scope of the invention is determined by the claims which follow.

What is claimed is:

1. A method for transferring substrates between an atmospheric environment and a vacuum environment, comprising:
   transferring a first unprocessed substrate from an atmospheric environment onto a first substrate support disposed in a first substrate transfer cavity formed in a load lock chamber body, the first transfer cavity having a first processed substrate that was processed in the vacuum environment positioned on a second substrate support;
   evacuating the first transfer cavity containing the first unprocessed substrate and the first processed substrate;
   transferring the first unprocessed substrate into a vacuum environment from the first substrate support; and
   transferring a second processed substrate that was processed in the vacuum environment from the vacuum environment onto the first substrate support.

2. The method of claim 1 further comprising:
   venting the first substrate transfer cavity; and
   transferring the first processed substrate from the second substrate support to the atmospheric environment.

3. The method of claim 2 further comprising:
   transferring a second unprocessed substrate onto the second substrate support from the atmospheric environment
   evacuating the first substrate transfer cavity containing the second unprocessed substrate and the second processed substrate;
   transferring the second unprocessed substrate from the second substrate support into the vacuum environment;
   transferring a third processed substrate that was processed in the vacuum environment to the second substrate support from the vacuum environment;
   venting the first substrate transfer cavity containing the third processed substrate and the second processed substrate;
   transferring the second processed substrate from the first substrate support to the atmospheric environment;
   transferring a third unprocessed substrate from the atmospheric environment onto the first substrate support; and
   evacuating the first substrate transfer cavity containing the third unprocessed substrate and the third processed substrate.

4. The method of claim 1 further comprising:
   transferring a second unprocessed substrate from the atmospheric environment onto a third substrate support disposed in a second substrate transfer cavity formed in the load lock chamber body, the second transfer cavity having a third processed substrate that was processed in the vacuum environment positioned on a fourth substrate support;

evacuating the second transfer cavity;

transferring the second unprocessed substrate into the vacuum environment from the third substrate support; and transferring a fourth processed substrate that was processed in the vacuum environment from the vacuum environment to the third substrate support.

5. The method of claim 4 further comprising:

venting the second substrate transfer cavity; and transferring the third processed substrate from the fourth substrate support to the atmospheric environment.

6. The method of claim 5 further comprising:

transferring a third unprocessed substrate onto the fourth substrate support from the atmospheric environment;

evacuating the second substrate transfer cavity containing the third unprocessed substrate and the fourth processed substrate;

transferring the third unprocessed substrate from the fourth substrate support into the vacuum environment;

transferring a fifth processed substrate that was processed in the vacuum environment onto the fourth substrate support from the vacuum environment;

venting the second substrate transfer cavity containing the fourth and fifth processed substrates;

transferring the fourth processed substrate from the third substrate support to the atmospheric environment;

transferring a third unprocessed substrate from the atmospheric environment to the third substrate support; and evacuating the second substrate transfer cavity containing the third unprocessed substrate and the fifth processed substrate.

7. The method of claim 1 further comprising:

cooling the first processed substrate.

8. The method of claim 7, wherein cooling further comprises:

moving the first processed substrate proximate to at least one of a floor or ceiling of the first transfer cavity.

9. The method of claim 8, wherein moving further comprises:

placing the first processed substrate in contact with the load lock chamber body.

10. The method of claim 1 further comprising:

transferring the first unprocessed substrate from the vacuum environment into a heating chamber formed in the chamber body.

11. The method of claim 10, wherein heating further comprises:

heating the substrate under vacuum conditions.

12. The method of claim 10, wherein heating further comprises:

sealing the heating chamber from a transfer chamber; and raising the pressure within the heating chamber.

13. The method of claim 10 further comprising:

transferring the heated, unprocessed substrate from the heating chamber into the vacuum environment.

14. The method of claim 1, wherein the first substrate support and the second substrate support are vertically aligned within the first substrate transfer cavity.

15. The method of claim 14, further comprising selectively adjusting the vertical alignment of the first and second substrate supports, wherein the first and second substrate supports are independently movable.

16. The method of claim 1, wherein the first substrate support and the second substrate support are vertically movable relative to each other within the first substrate transfer cavity.

17. A method for transferring substrates between an atmospheric environment and a vacuum environment, comprising:

transferring a first unprocessed substrate from an atmospheric environment onto a first substrate support disposed in a first substrate transfer cavity formed in a load lock chamber body, the first substrate transfer cavity having a first processed substrate that was processed in the vacuum environment positioned on a second substrate support;

evacuating the first transfer cavity containing the first unprocessed substrate and the first processed substrate;

transferring the first unprocessed substrate to a vacuum environment from the first substrate support; and transferring a second processed substrate that was processed in the vacuum environment from the vacuum environment to the first substrate support, wherein the first processed substrate is moved proximate to the load lock chamber body using the first substrate support when the first processed substrate has been relatively cooled, thereby facilitating heat exchange between the first processed substrate and the load lock chamber body.

18. The method of claim 17, wherein the first processed substrate is moved in contact with the load lock chamber body.

\* \* \* \* \*